United States Patent

Divakaruni et al.

[11] Patent Number: 5,198,376
[45] Date of Patent: Mar. 30, 1993

[54] METHOD OF FORMING HIGH PERFORMANCE LATERAL PNP TRANSISTOR WITH BURIED BASE CONTACT

[75] Inventors: Sridhar Divakaruni, South Burlington, Vt.; Badih El-Kareh, Austin, Tex.; Eric D. Johnson, Westford, Vt.

[73] Assignee: International Business Machines Corporation, Armonk, N.Y.

[21] Appl. No.: 909,938

[22] Filed: Jul. 7, 1992

[51] Int. Cl.⁵ .......................................... H01L 21/265
[52] U.S. Cl. ...................................... 437/32; 437/28; 437/917; 437/162; 148/DIG. 96
[58] Field of Search ............... 437/32, 917, 31, 72, 437/78, 79, 28, 162, 59, 55; 148/DIG. 96; 357/35

[56] References Cited

U.S. PATENT DOCUMENTS

| | | | |
|---|---|---|---|
| 3,703,420 | 11/1972 | Vora | 148/175 |
| 4,466,178 | 8/1984 | Soclof | 29/576 |
| 4,466,180 | 8/1984 | Soclof | 29/580 |
| 4,492,008 | 1/1985 | Anantha et al. | 357/35 |
| 4,733,287 | 3/1988 | Bower | 357/35 |
| 4,704,786 | 11/1987 | Kub | 437/32 |
| 4,956,305 | 9/1990 | Arndt | 437/31 |
| 4,965,217 | 10/1990 | Desilets et al. | 437/32 |
| 4,980,302 | 12/1990 | Shimizu | 437/32 |
| 5,047,828 | 9/1991 | Soclof | 357/35 |

FOREIGN PATENT DOCUMENTS 0167459 8/1985 Japan.
0300554 12/1988 Japan.

Primary Examiner—Brian E. Hearn
Assistant Examiner—Tuan Nguyen
Attorney, Agent, or Firm—Heslin & Rothenberg

[57] ABSTRACT

A high performance PNP lateral bipolar transistor is described, incorporating at least two trenches extending from the upper P⁻ surface of a semiconductor substrate almost to a buried N⁺ layer. The floor of one trench is heavily N-doped to establish a connection between the buried N⁺ layer and an N⁻ diffusion in the walls of the trench. When the trenches are backfilled with P⁺ polysilicon a lateral PNP is formed having a buried base contact.

7 Claims, 2 Drawing Sheets

METHOD OF FORMING HIGH PERFORMANCE LATERAL PNP TRANSISTOR WITH BURIED BASE CONTACT

TECHNICAL FIELD

The invention relates to a method for forming a PNP lateral transistor in a semiconductor substrate. The method involves differentially doping the floor and walls of a trench so as to provide a base which is electrically connected to a buried contact.

BACKGROUND ART

Complementary bipolar NPN and PNP structures are highly desirable for several digital and analog applications. However, integrating PNP structures into BICMOS circuits presents particular challenges. A lateral bipolar PNP comprises two P-doped regions (emitter and collector) separated by a third N-doped region (base). The separation between the emitter and collector determines the base width of the transistor. The injection efficiency is reduced and the base transit time is increased resulting in a low current gain and small frequency response. Therefore, producing a base of the correct Gummel number is critical to performance. Typical state-of-the-art BICMOS technologies have silicided junctions, as a consequence of which the silicide at the diffusions in "narrow base" diffusions tends to degrade the performance of the device, particularly for shallow junction technologies, and the emitter efficiency of an integrated PNP is poor.

A second problem arises from the fact that a boron diffusion, when it is intended for a source/drain of an FET or the base contact of an NPN device, is shallow, but for a lateral PNP, a much deeper diffusion is preferred because the emitter efficiency or the amount of current drive from the PNP device is a function of the junction perimeter depth. If the emitter region is formed by diffusion into the base, the diffusion profile is curved on the sides. A curved profile provides only a very small emitter junction area where the base width is narrowest. Moreover, because the frequency response of a lateral PNP transistor is inversely proportional to the square of the electrical base width, a larger electrical base width reduces the frequency response $f_T$.

A solution to the difficulties of contacting deep base diffusions is offered by creating a trench. One can then create an emitter from the entire trench sidewall. This provides a larger injecting area and an efficient cross-section to make a high-performance PNP. However, in fabricating integrated circuits, trench based lateral PNPs become less attractive as a function of the number of additional steps, particularly masking steps, required to create them.

There is therefore a need for a method for fabricating a high performance PNP that minimizes additional masks and is compatible with BICMOS technology.

It is an object of the invention to provide a high-performance (high current gain and good frequency response) PNP transistor.

It is a further object to provide a PNP transistor that has both high emitter efficiency and low base resistance.

It is a further object to provide a PNP transistor that can be paired with a complementary NPN transistor in a BICMOS integrated circuit.

It is a further object to provide a process for fabricating a lateral PNP that is compatible with other fabrication steps for a BICMOS circuit.

It is a further object to provide a process that requires only two masking steps in addition to those needed for fabricating the rest of a complementary bipolar PNP-NPN pair in BICMOS technology.

It is a further object to provide a process for differentially doping the walls and floor of a trench structure in integrated circuit fabrication.

DISCLOSURE OF THE INVENTION

The invention relates to a method for forming a lateral transistor in a substrate, or an array of lateral transistors, preferably PNP transistors, on a semiconductor device, comprising:

(a) forming a first heavily doped impurity-containing zone of a first impurity type, preferably N, extending over a portion of a semiconductor substrate;

(b) forming a second impurity-containing zone of a second impurity type, preferably P, on top of the first zone;

(c) providing a reach-through to the first heavily doped zone;

(d) forming a first non-erodible layer on top of the second zone;

(e) by means of a first mask, defining a series of trenches, preferably parallel, etched into the second impurity zone but not reaching the first impurity zone;

(f) forming a second, thin layer of silicon oxide on the walls and floor of the trenches;

(g) using a second mask to cover alternating trenches, implanting a heavily doped implantation of an impurity of a first impurity type in the bottom of each unmasked trench, said implantation extending to the heavily-doped first impurity-containing zone;

(h) removing the second silicon oxide layer from the unmasked trenches;

(i) selectively defining a sidewall implant or diffusion of a first impurity type in each of the unmasked trenches;

(j) removing remaining second silicon oxide layer; and (k) back-filling each trench with polysilicon heavily doped with a second impurity type.

In a slightly different aspect the invention relates to a method for forming a PNP lateral transistor in a substrate comprising:

(a) doping a portion of a surface of the substrate with an N-type impurity to form an N+. layer;

(b) epitaxially growing a lightly P-doped layer on top of the substrate;

(c) implanting a heavily doped N+ reach-through from the surface of the P− layer to the N+ layer;

(d) providing an oxide layer on the surface of the P-layer, either by local oxidation or deposition and patterning;

(e) slotting the P-doped layer to provide at least two, preferably parallel, trenches;

(f) implanting an N-type impurity in the floor of one of the trenches such that the resulting heavily-doped N implant extends to the N+ layer;

(g) doping the walls of one trench with an N-type impurity;

(h) filling all the trenches with heavily P-doped polysilicon; and (i) metallizing the patterning the substrate to provide electrical connections to the P-doped polysilicon and to the N+ layer.

In addition to satisfying the objectives stated above, the instant invention has the advantage that one can easily tune the device to a desired level of breakdown voltage ($BV_{CEO}$) simply by adjusting the spacing between the trenches 8 and 9. Other technologies for PNP transistors require extensive configurational and process changes or tradeoffs with other parameters to accommodate modification of $BV_{CEO}$.

The invention also relates to a process for differentially doping the floor and walls of a sub-millimeter or, preferably, a submicron trench in a silicon semiconductor surface comprising:

(a) providing a thin layer of oxide on the walls and floor;

(b) implanting a P or N-type impurity in the floor of the trench by vertical ion implantation through the oxide layer;

(c) removing the oxide layer; and (d) diffusing a P or N type impurity in the walls.

For a PNP transistor, which is preferred, the walls and floor are doped with phosphorus, and phosphorus doping is heavier in the floor than in the walls. Preferably the walls are doped by open tube diffusion.

BEST MODE FOR CARRYING OUT THE INVENTION

In the following description, the substrate material is silicon. It will be apparent to one skilled in the art that other materials can be used and further that other P and N impurities are operable in this invention in addition to those discussed in the present example which are, respectively, boron (P) and arsenic, antimony, or phosphorus (N).

Figure 1:
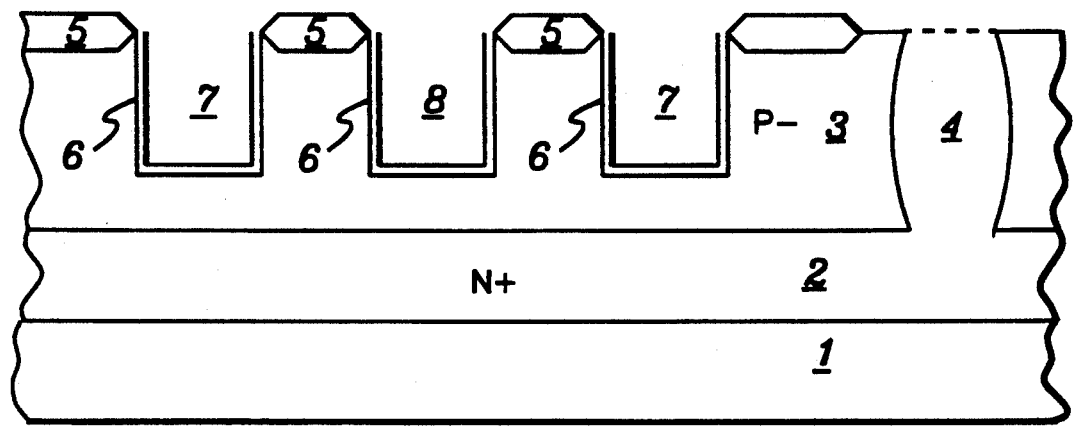
FIGS. 1-4 are schematic representations of a lateral transistor being formed according to the invention.

With specific reference to the drawings to aid in an understanding of the method, FIG. 1 shows a silicon substrate 1 having diffused therein an N+ type region 2 of 1 to 5 microns thickness, and with the P−region 3 epitaxially grown thereon. The P−epitaxial region 3 contains about $10^{15}$ atoms of boron per cc; the N+ buried layer 2 contains about $10^{19}$ to $10^{20}$ atoms of antimony per cc. A reach-through 4 is provided to the buried N+ layer by a heavily doped ion implantation and diffusion, and the surface of the P−layer is provided with a layer of oxide 5 either by local oxidation or deposition and patterning. The oxide layer 5 should be relatively thick (0.2 to 0.5 μm) in comparison to a layer of oxide 6 which will be created in the trenches; the reasons for this will become apparent below. Oxide has been used for simplicity, but it will be apparent that other materials (e.g. silicon nitride or aluminum oxide) of appropriate thickness could be used as well. All of these are subsumed in the term non-erodible material. A first mask (not shown) is used to define a series of parallel trenches 7 and 8 which will ultimately become the collectors and the emitters respectively. For shorthand trench 7 will be called the collector trench and trench 8 the emitter trench. They alternate across the surface of the substrate. The floor and walls of the trenches are then provided with a thin oxide layer 6. The layer 6 is optimally 10 nm to 50 nm thick so that it will function as described below.

Figure 2:
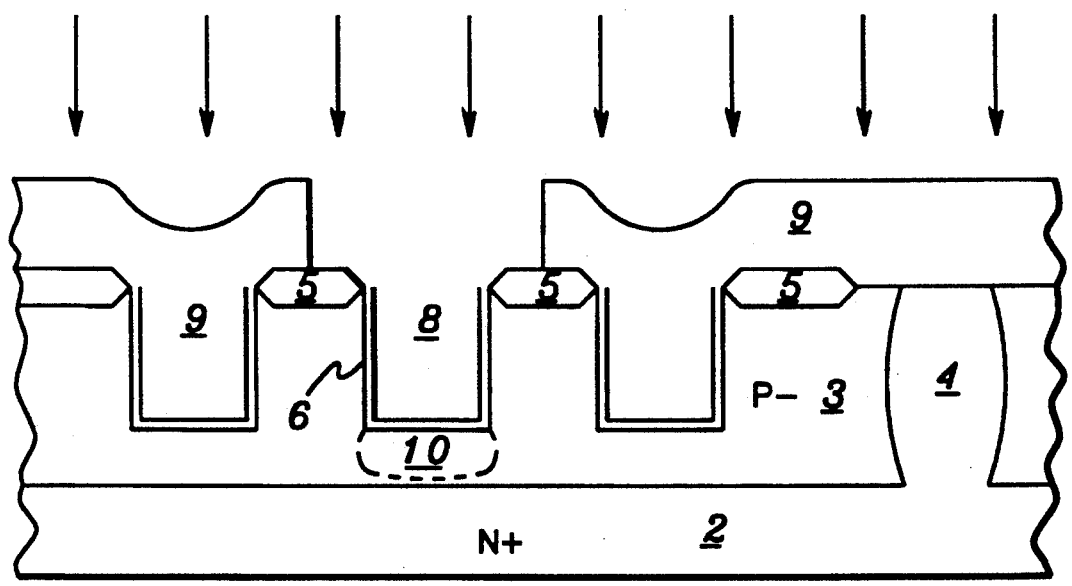

FIG. 2 shows the next steps. The first mask is removed and a second mask 9 blocks all of the collector trenches. Phosphorus or arsenic is implanted at normal incidence through the thin oxide 6 of the floor of trenches 8 to provide a heavily doped N implant ($5 \times 10^{18}$ atom/cc) 10 from the floor to the N+ buried layer 2. The oxide 6 protects the walls during the implantation so that only the floor is implanted.

Figure 3:
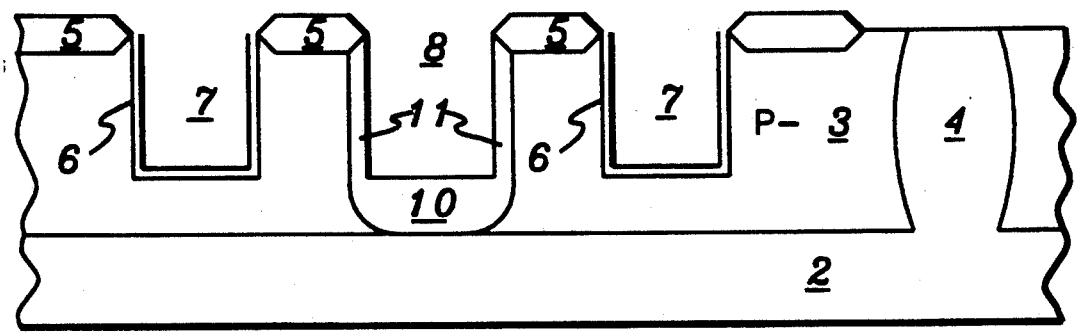

FIG. 3 shows the next steps. With mask 9 still in place, the thin insulator 6 is removed from the floor and sidewalls of emitter trenches 8, preferably by a dip etch. The etch should be timed to remove the thin oxide 6 without appreciably removing the oxide 5. The mask 9 may now be removed. Phosphorus or arsenic is diffused, preferably by open tube diffusion, although an angled implant could be used, to form the PNP transistor base diffusion 11 which is linked to the buried N+ layer 2 by implant 10. The concentration of N-type impurity in the base diffusion 11 should be about $10^{18}$ atom/cc.

Figure 4:
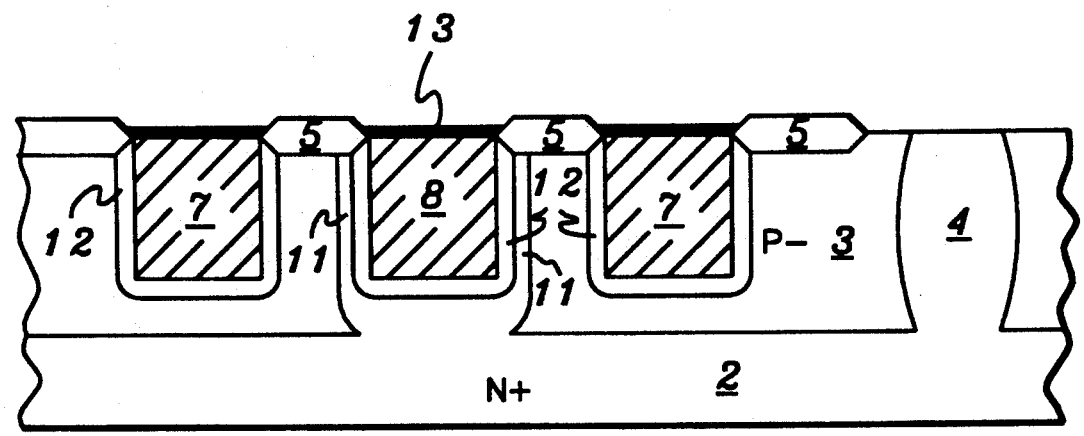

FIG. 4 shows the remaining steps in the process. The thin oxide 6 is removed from the collector trenches 7 as before by dip etching, and a heavily P+ doped polysilicon ($>10^{19}$ atom /cc) fill is deposited, planarized and etched back in each of the trenches. Controlled heating causes a diffusion of P+ dopant from the polysilicon into the P− epitaxial layer to form P-enriched zones 12. An array of PNP transistors comprising emitters 8, collectors 7 and bases 11 have thus been created. The transistors have low-resistance buried base leads and are fabricated using only two additional masks. Subsequent processing (patterning and metallization) is conventional and is carried out in accordance with the design of the IC to provide the silicide 13 shown in FIG. 4.

An interesting feature of the process that may be of general applicability is the creation of differently doped regions in the walls and floor of the same trench by the technique of implanting through an oxide layer into the floor of the trench, removing the oxide, and diffusing a second concentration or species into the walls.

In the particular instance of the present PNP lateral transistor, the ability to differentially dope the walls and floor of the trench leads to an especially valuable feature of the process: one can avoid a tradeoff between emitter efficiency and base resistance. In earlier known technologies there is commonly an inverse relationship such that any attempt to increase emitter efficiency is inevitably accompanied by an increase in base resistance.

While the invention has been particularly shown and described with reference to preferred embodiments thereof, it will be understood by those skilled in the art that other changes in form and details may be made therein without departing from the spirit and scope of the invention.

We claim:

1. A method for forming a PNP lateral transistor in a substrate comprising:

(a) doping a portion of a surface of said substrate with an N-type impurity to form an N+ layer;

(b) epitaxially growing a lightly P-doped layer on top of said substrate;

(c) implanting a heavily doped N+ reach-through from the surface of said lightly P-doped layer to said N+ layer;

(d) providing an oxide layer on the surface of said lightly P-doped layer;

(e) slotting said P-doped layer to provide at least two trenches;
(f) implanting an N-type impurity in the floor of one of said trenches such that the resulting heavily-doped N implant extends to said N+ layer;
(g) doping the walls of said one trench with an N-type impurity;
(h) filling said trenches with heavily P-doped polysilicon; and
(i) providing electrical connections to said P-doped polysilicon and said N+ layer by metallizing and patterning.

2. A method according to claim 1 wherein said oxide layer on the surface of said P-layer is provided by local oxidation.

3. A method according to claim 1 wherein said oxide layer on the surface of said P-layer is provided by deposition and patterning.

4. A process for forming an array of lateral transistors on a semiconductor device which comprises:
(a) forming a first heavily doped impurity-containing zone of a first impurity type extending over a portion of a semiconductor substrate;
(b) forming a second impurity-containing zone of a second impurity type on top of said first zone;
(c) providing a reach-through to said first heavily doped zone.
(d) forming a first insulating layer on top of said second zone;
(e) by means of a first mask, etching a series of trenches etched into said second impurity zone but not reaching said first impurity zone;
(f) forming a second, thinner layer of silicon oxide on the walls and floor of said trenches;
(g) using a second mask to cover alternating trenches, implanting a heavily doped implantation of an impurity of a first impurity type in the bottom of each unmasked trench, said implantation extending to said heavily-doped first impurity-containing zone;
(h) removing said second silicon oxide layer from said unmasked trenches;
(i) selectively implanting a sidewall region of a first impurity type in each of said unmasked trenches;
(j) removing remaining second silicon oxide layer; and
(k) back-filling each trench with polysilicon heavily doped with a second impurity type.

5. A process according to claim 4 wherein said first impurity type is N, said second impurity type is P, and said process forms a PNP lateral transistor.

6. A process for forming an array of lateral transistors on a semiconductor device which comprises:
(a) forming a first heavily doped impurity-containing zone of a first impurity type extending over a portion of a semiconductor substrate;
(b) forming a second impurity-containing zone of a second impurity type on top of said first zone;
(c) providing a reach-through to said first heavily doped zone.
(d) forming a first non-insulating layer on top of said second zone;
(e) by means of a first mask, etching a series of trenches into said second impurity zone but not reaching said first impurity zone;
(f) forming a second, thinner layer of silicon oxide on the walls and floor of said trenches;
(g) using a second mask to cover alternating trenches, implanting a heavily doped implantation of an impurity of a first impurity type in the bottom of each unmasked trench, said implantation extending to said heavily-doped first impurity-containing zone;
(h) removing said second silicon oxide layer from said unmasked trenches;
(i) selectively diffusing a sidewall region of a first impurity type in each of said unmasked trenches;
(j) removing remaining second silicon oxide layer; and
(k) back-filling each trench with polysilicon heavily doped with a second impurity type.

7. A process according to claim 6 wherein said first impurity type is N, said second impurity type is P, and said process forms a PNP lateral transistor.

* * * * *